(12) United States Patent
Kingswood et al.

(10) Patent No.: US 6,449,467 B1
(45) Date of Patent: Sep. 10, 2002

(54) POWER CONTROL OF RF SIGNALS WITH BOOSTER MODULE

(75) Inventors: Andrew Christopher Kingswood, Basingstoke; Timothy Land, Fleet, both of (GB)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/381,846

(22) PCT Filed: Mar. 18, 1998

(86) PCT No.: PCT/EP98/01775

§ 371 (c)(1),
(2), (4) Date: Oct. 26, 1999

(87) PCT Pub. No.: WO98/44654

PCT Pub. Date: Oct. 8, 1998

(30) Foreign Application Priority Data

Mar. 27, 1999 (GB) ............................................. 9706423

(51) Int. Cl.[7] .................................................. H04B 1/00
(52) U.S. Cl. ...................................... 455/127; 455/571
(58) Field of Search ................................ 455/127, 571, 455/69

(56) References Cited

U.S. PATENT DOCUMENTS 5,457,814 A  * 10/1995  Myrskog et al. ............ 455/571
5,995,813 A  * 11/1999  Ishikura et al. ............. 455/127
6,029,074 A  *  2/2000  Irvin .......................... 455/571

FOREIGN PATENT DOCUMENTS

| EP | 331 435 | 9/1989 | |
| EP | 392 132 | 10/1990 | |
| EP | 635 935 | 1/1995 | |
| JP | 0 392 132 | * 10/1990 | ........... H04B/7/005 |

* cited by examiner

Primary Examiner—Daniel Hunter
Assistant Examiner—Alan Gantt
(74) Attorney, Agent, or Firm—Merchant & Gould P.C.

(57) ABSTRACT

Power control of output RF signals in a mobile radio communication network is described. A base transceiver has a booster module (12) attached for increasing the power of the output RF signals. A power levelling loop controls the transmission power of the unboosted transceiver. When a booster module (12) is attached, the loop is extendible to control the power of the boosted RF signal output from the booster module. A node (52, 53) connects the amplifier circuit (4) of the transceiver and booster module (12). The node allows an RF signal to be supplied from the amplifier circuit (4) to the booster module (12) for transmission. The node (52, 53) also forms part of the extended power control loop and allows the detected level of the boosted signal to be returned to the transceiver.

7 Claims, 4 Drawing Sheets

POWER CONTROL OF RF SIGNALS WITH BOOSTER MODULE

FIELD OF THE INVENTION

This invention relates to power control for RF signals, and particularly to power control of RF signals in a mobile communication network.

BACKGROUND TO THE INVENTION

In a mobile communication network, a base transceiver system transmits and receives radio signals between a base station and mobile stations. It is necessary to control the transmitted power levels of the radio signals and this is done in dependence on a variety of parameters in accordance with the GSM and other standards. In any mobile communication system, it is necessary to have fairly accurate control over the Dower levels of the transmitted signals in order to ensure that they reach mobile stations with an adequate but not excessive power level, and to prevent interference between neighbouring base stations operating in the same frequency channel.

Cell configurations vary widely. For large cells, or for cells where there is considerable signal attenuation, it is desirable to boost the transmitted power level. This can be done using a booster amplifier which amplifies the already amplified signal. A booster may not always be necessary and therefore it is particularly desirable to provide a system in which a booster can be included if necessary with minimal modifications to the remainder of the system. In particular, it is desirable to avoid the use of over-complex circuitry and the need for user setup each time a booster is introduced.

This problem has not previously been satisfactorily solved since in existing systems all the necessary power amplification has been included within a single mechanical confinement. Moreover, in order to accurately control the power levels, a power levelling loop is utilised. It has previously been assumed that the incorporation of the booster into the amplification circuitry and within the power levelling loop would require multiple analogue connections and complex hardware and software modifications to existing products. Moreover, with a boosted power level the problem of noise pick-up becomes more significant.

SUMMARY OF THE INVENTION

According to one aspect of the present invention there is provided a power levelling loop for a base transceiver system comprising:

first amplification circuitry connected to receive an RF input signal and to supply a first amplified signal to an output node;

first detection circuitry for detecting said first amplified signal and connectable to modify the amplification factor of the first amplification circuitry in dependence on the detected level of the first amplified signal;

switch circuitry having a first input connected to the first detection circuitry and a second input connected to means for receiving a detected level of a second amplified signal, the switch being controllable to select the first or second input, wherein when the second input is selected the amplification factor of the first amplification circuitry is modified in accordance with the detected level of the second amplified signal.

In the preferred embodiment, a coaxial cable is connected to the output node. The preferred embodiment of the invention centres on the use of a closed loop system utilising one cable for two paths. The cable can be used to transmit the first amplified signal (the amplified RF signal) from the first amplification circuitry and to feed back the detected level of the second amplified signal (the boosted signal) to the power levelling loop. The detected level of the boosted signal is an analogue voltage which varies at a very low frequency compared to the RF input signal. Thus it is possible to use the coaxial cable as a path both for the detected level of the boosted signal and for outputting the amplified RF signal.

In a modular base transceiver system (BTS), the power levelling loop can be included in a transceiver module which has an input node for receiving the RF input signal and which provides the output node from which the first amplified signal is supplied. Such a modular system can also include a booster module for a base transceiver system comprising:

an input node for receiving a first amplified signal a booster amplifier for generating a boosted signal from the amplified signal;

a detection circuit for detecting the boosted signal and for generating a detected level of the boosted signal; and means for transmitting the detected level of the boosted signal to a power levelling loop via the input node of the booster module.

The transmitting and receiving means can each comprise a device for allowing passage of the low frequency detected level of the boosted signal while preventing passage of the high frequency RF signal. This can be implemented by decoupling the transmitting means and receiving means from the high frequency RF signals, for example by use of an inductance or an RF choke.

In the preferred embodiment, as only existing cabling is used between the output of the transceiver module and the input of the booster module, changes to other modules within the BTS are minimised. Moreover, the possibility of noise pick-up is minimised since the feedback path is maintained in a coaxial cable and does not pass near any high speed digital signal lines.

It will be noted however that while the use of a common coaxial cable represents a particularly useful and advantageous implementation of the invention, it would also be possible to implement transceiver and booster modules where the detected level of the second amplified signal is fed back to the power levelling loop in some other manner. For example, an extra jumper accessible on the backplane of a rack for receiving the modules could be used. This would require a carefully designed backplane to avoid the problems of noise pick-up.

For a better understanding of the present invention and to show how the same may be carried into effect, reference will now be made by way of example to the accompanying drawings.

DESCRIPTION OF THE PREFERRED EMBODIMENT

Figure 1:
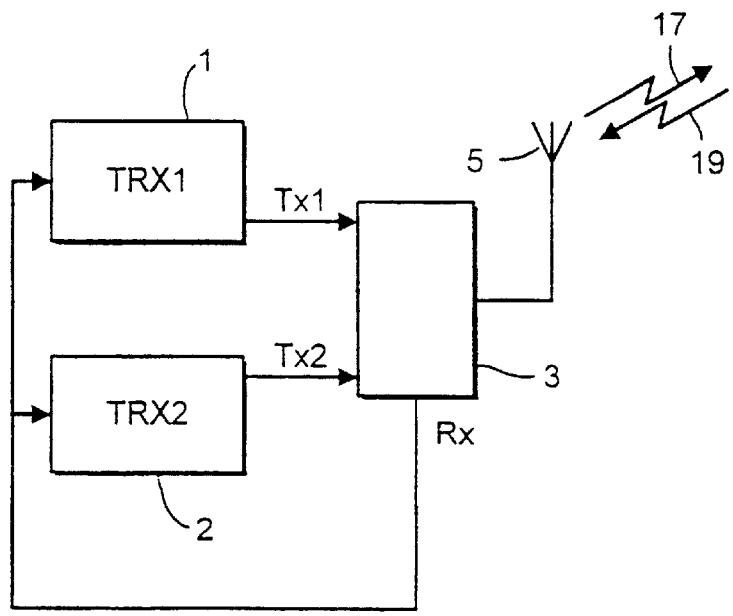
FIG. 1 is a block diagram of a two transceiver base transceiver system (BTS)

FIG. 1 is a block diagram of a two transceiver base transceiver system (BTS) in a mobile communication system by way of background. Each of two transceivers TRX1, TRX2 contains transmit and receive circuits which are known in the art. The outputs of the transmit circuits Tx1, Tx2 are connected to a filter circuit 3 which supplies them in a form for transmission via an antenna 5. The transmitted radio signals are denoted by reference numeral 17. The antenna 5 also receives radio signals 19 from mobile stations and supplies these to the receive circuits in the transceivers TRX1, TRX2 as received signal Rx.

Figure 2:
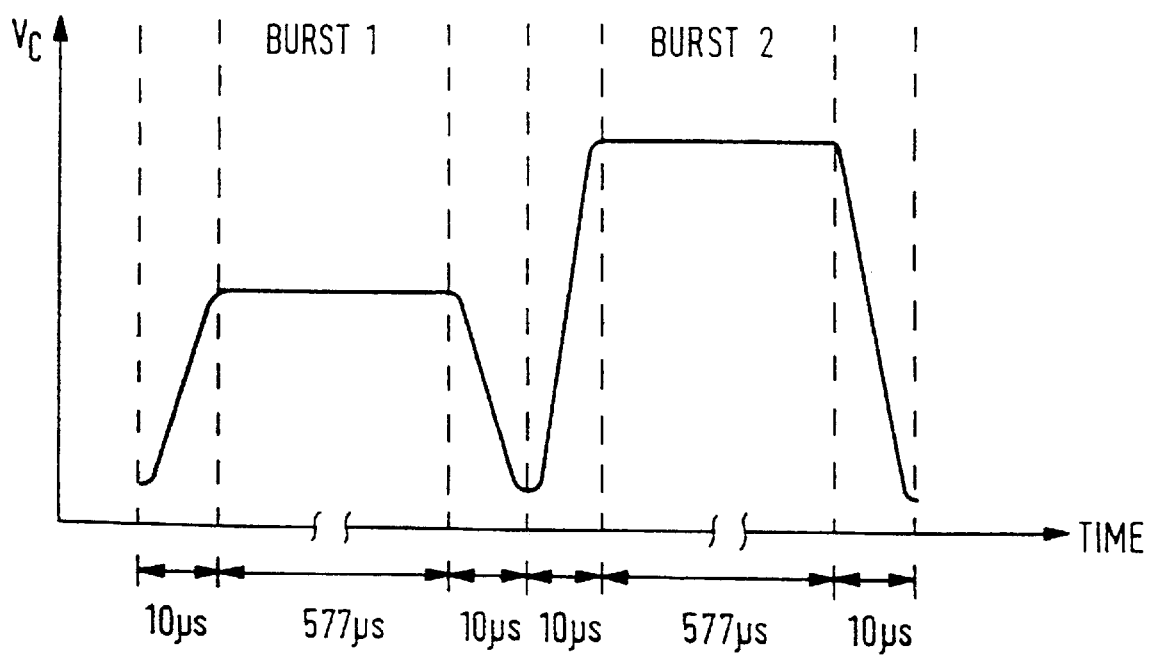
FIG. 2 is an illustration of a power control envelope.
Figure 6:
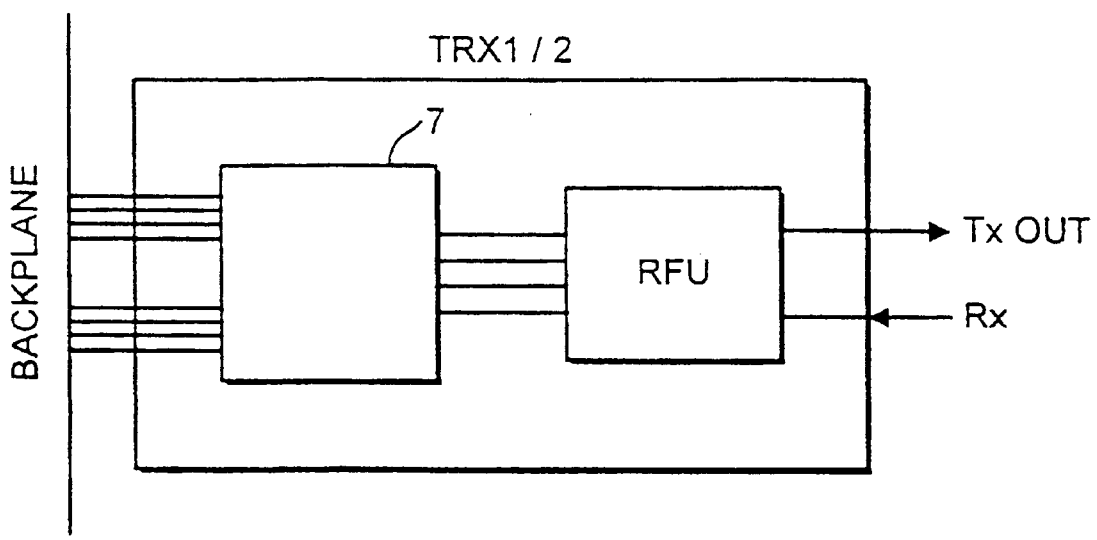
FIG. 6 is a block diagram Illustrating the internal components of a transceiver.

The transmit circuits include a modulation circuit for modulating data to be transmitted onto a carrier wave at an appropriate carrier frequency. At present, the GSM standard has a carrier frequency of 900 MHz. As shown in FIG. 6, each transceiver TRX comprises a processor 7 and an RF unit RFU. Data to be transmitted is supplied from the processor 7. The processor 7 and RF unit also down-convert, filter, demodulate, and decodes the received signal Rx supplied to it from the filter unit. The processor 7 also supplies control signals to the RF unit. In particular, the processor 7 supplies a power control signal Vc which controls the power level of the signal transmitted by the transceiver. That power control signal takes the form of a voltage envelope for defining the voltage levels and ramp times for each signal burst in a TDMA system. An exemplary voltage envelope is illustrated in FIG. 2. The ramp times and duration for each burst is set according to the GSM standard. Typical values are 10 $\mu$s for the ramp times and 577 $\mu$s for the duration of the burst. The amplitude of the voltage envelope depends on the required power level and this is set according to a number of different parameters, including the cell size in a cellular mobile communication network, the power efficiency of the antenna and the reported signal strength by the mobile station.

Figure 3:
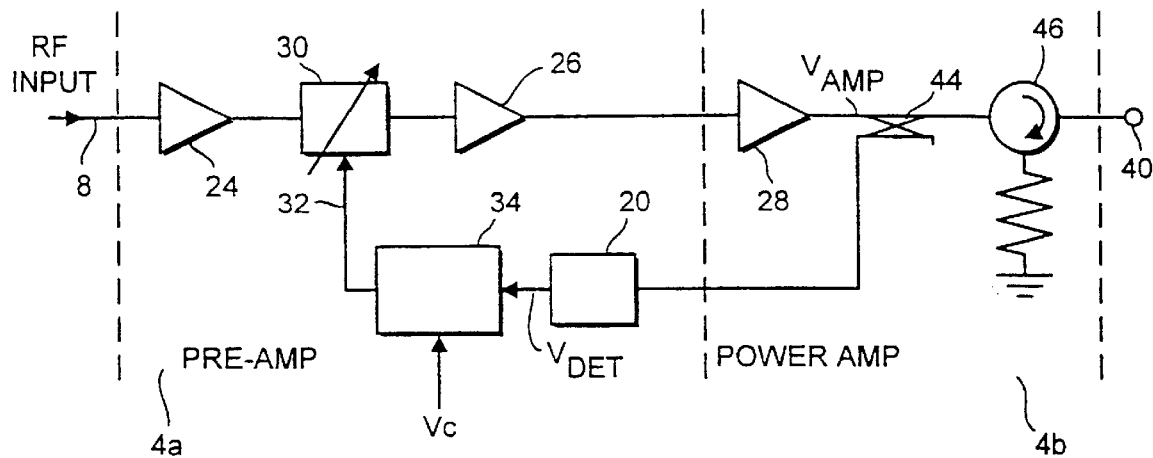
FIG. 3 illustrates a power levelling loop within a transceiver according to an existing architecture.
Figure 5:
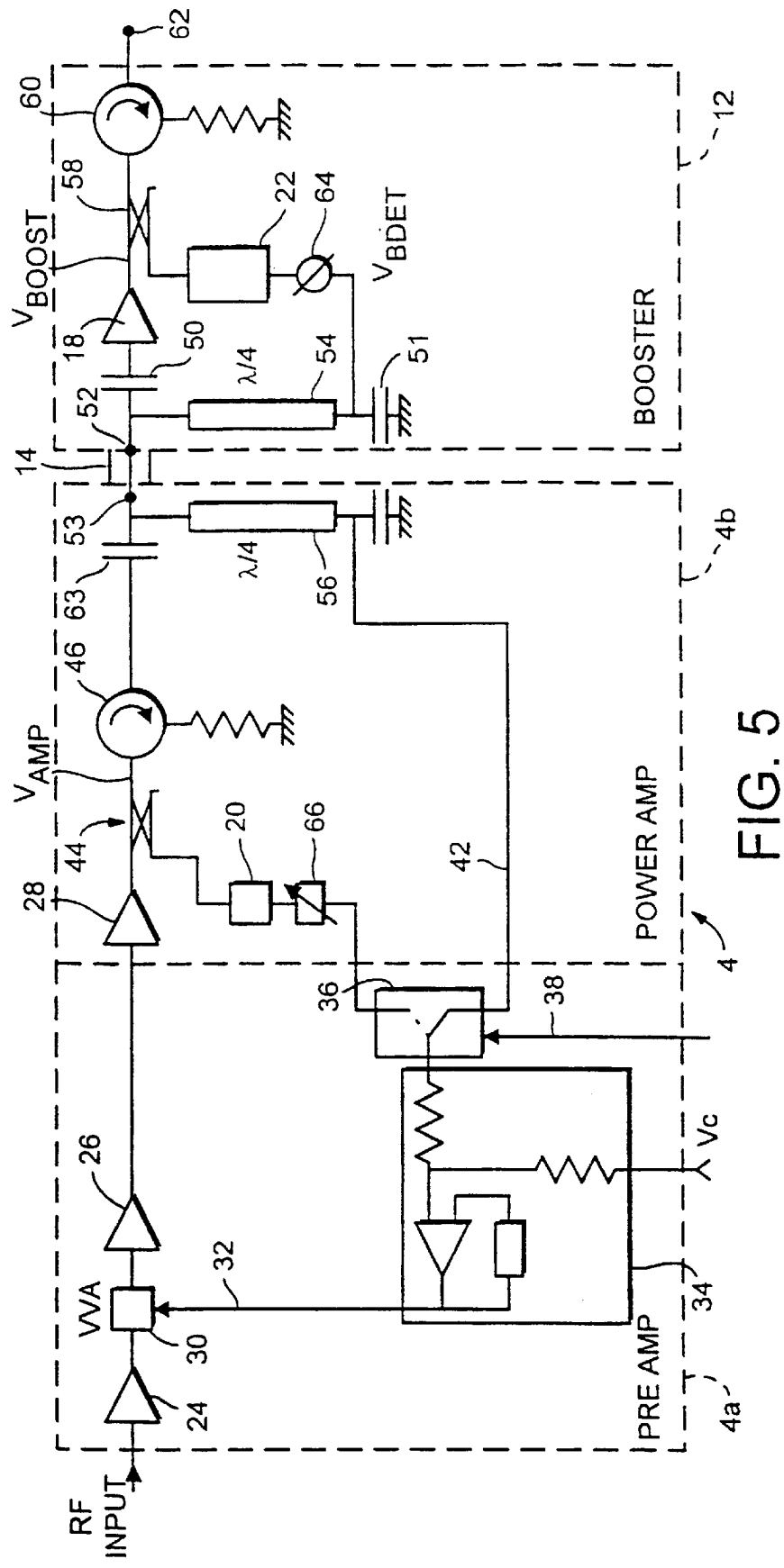
FIG. 5 illustrates a power levelling loop including a booster module.
Figure 7:
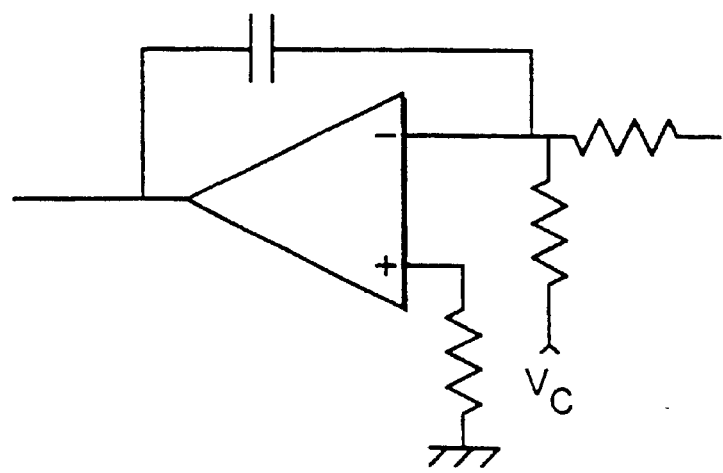
FIG. 7 is a circuit diagram illustrating the components of a suitable integrator.

FIG. 3 illustrates a power levelling loop within a transceiver TRX. An amplifying circuit 4 includes a pre amp stage 4a with first and second pre amp amplifiers 24, 26 and a power amp stage 4b with a power RF amplifier 28. The pre amp stage 4a receives the modulated carrier wave as the RF input signal 8. The pre amp stage 4a also includes a gain control circuit 30, for example a variable voltage attenuator (VVA). The VVA 30 is connected between the first and second amplifiers 24, 26 and receives a control input 32 from an integrator 34. The integrator 34 is a standard integrator and will not be described further herein although some of its components are shown in FIG. 5. A suitable integrator is shown in FIG. 7. The RF signal 8 which is input to the pre amp stage 4a is amplified by the first RF amplifier 24 before being supplied to the VAA 30 and the second amplifier 26. The second amplifier 26 further amplifies the signal in dependence on the attenuation set at the VVA 30 by the control signal 32. The thus amplified signal is supplied to the power RF amplifier 28 which implements the bulk of the power amplification. The amplified signal Vamp is supplied to the filter circuit 3 via a circulator 46. Reference numeral 40 represents the connecter to the filter circuit 3.

The integrator 34 receives a detected voltage level Vdet which represents the peak voltage of the amplified signal Vamp from the power amplifier 28. The detected voltage level is detected by a detection circuit 20 from a Proportion of the amplified signal derived from a power coupler 44. This can be implemented as an edge coupled, parallel line, microstrip hybrid directional coupler. The integrator also receives the power control signal Vc from the processor 7 and determines the difference 32 between Vc and Vdet. This difference 32 is applied to the VVA 30 to control its attenuation. Thus, a power levelling loop is established.

FIG. 3 represents an existing power control architecture for a transceiver, in which all the amplifier stages are included within the power levelling loop. However, for an extended cell application, a power booster may sometimes be necessary. As it is also necessary to accurately control the boosted power level, it is desirable to place the booster within the power levelling loop.

Figure 4:
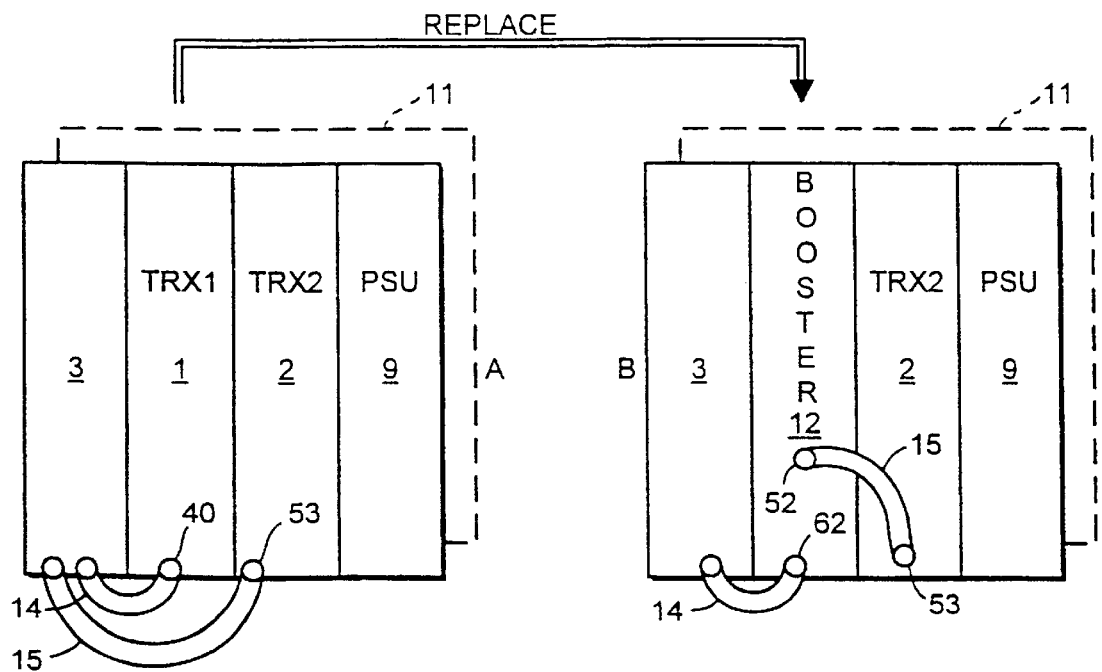
FIG. 4 represents a modular structure for a base transceiver system (BTS)

FIG. 4 represents a modular structure of a BTS for achieving this. The BTS comprises a rack 11 with a backplane and a plurality of connectors (not shown) to which are respectively connected a plurality of modules. FIG. 4 illustrates in state A a filter module 3, a first transceiver module TRX1, a second transceiver module TPX2 and a power supply module PSU 9. There are other modules as necessary to implement the functionality of a BTS. The transceivers are easily interchangeable by virtue of coaxial cable connections 14, 15 between each transceiver and the filter module 3. The coaxial connections illustrated in state A are those necessary for the transceivers TRX1, TPX2 to operate as transmitters, the necessary connections for them to operate as receivers are not shown. The first transceiver TRX1 can be replaced by a booster module 12 by releasing the coaxial cable 14 from the connecter 40 on the first transceiver and connecting it to an output connecter 62 on the booster module. The coaxial cable 15 on the remaining transceiver TRX2 is connected to an input connecter 52 on the booster module 12 (see B in FIG. 4) No modifications are needed to the backplane when the transceiver module TRX1 is replaced by the booster module 12 as will become clearer in the following.

FIG. 5 is a circuit diagram showing the configuration of the power levelling loop with the booster module 12 present. Like numerals denote like parts as in FIG. 3.

The booster module 12 contains an RF amplifier 18 which provides a boosted signal Vboost. The Dower amplifier circuit 4 contains a first one of two peak detectors 20. A second one of the two peak detectors 22 is connected in the booster circuit 12 after the RF amplifier. A port ion of the boosted signal Vboost is coupled into the second detector 22 via a coupler 58. In the described embodiment the coupler is an edge coupled, parallel line, microstrip) hybrid directional coupler, although other implementations are possible. The main component of the boosted signal Vboost is supplied to the output connecter 62 via a circulator 60 for supply to the filter circuit. The second detector 22 supplies a detected voltage level $V_{BDET}$ representative of the peak voltage of the RF boosted signal Vboost. The output signal from the second detector 22 is transmitted back to power levelling circuitry 30, 34 of the power amplifier 4 via the coaxial cable 14.

The coaxial cable 14 both supplies the amplified signal Vamp from the power amplifier 4 to the booster 12 and returns the detected level $V_{BDET}$ of the boosted signal from the booster 12 to the TRX 2.

This is achieved by use of an RF choke 54, for example an inductance or quarter wave track, and capacitors 50 and 51. The RF choke 54 and the capacitor 51 are connected in series between the input connector 52 and ground. The capacitor 50 is connected between the input connector 52 and the RF boost amplifier 18. The detected level $V_{BDET}$ is supplied to the RF choke 54 at its connection to the capacitor 51.

It will be appreciated that the detected level $V_{BDET}$ varies very slowly and may be at a constant d.c. level for extended periods. Its frequency of variation is related to the burst frequency of TDMA bursts. In any event, a capacitor represents an open circuit to the detected level $V_{BDET}$, while the RF choke represents a low resistance path. Thus, the detected level is transmitted through the RF choke 54, via the coaxial cable 14 to the transceiver TRX2 output 53. It is prevented from affecting the RF amplifier 18 by virtue of the capacitor 50. A similar RF choke and capacitor arrangement is provided in the power amp stage 4b of the TRX to receive the detected level $V_{BDET}$. Thus, a capacitor 63 prevents the detected level from feeding back to the power amp 28 while an RF choke 56 transmits it along line 42 to the pre amp stage 4a.

The line 42 is fed through to the pre amp stage 4a to supply the detected level of the boosted signal $V_{BDET}$ to one input of a three terminal switch 36. A second input of the switch 36 receives the detected level Vdet of the amplified signal from the original power levelling loop as described above with reference to FIG. 3.

The switch 36 in the pre amp stage 4a is used to apply to the integrator 34 either the output Vdet from the first detector 20 or the output $V_{BDET}$ from the second detector 22, if the booster is fitted. A control signal 38 determines which input is applied to the integrator 34. The control signal can be generated manually or automatically by detecting the presence of the booster.

Thus, with the circuitry as illustrated in FIG. 5, when the booster is not present, the power amplified signal Vamp has its level controlled via the power levelling loop constituted by the first detector 20, integrator 34 and attenuation circuitry 30 and is generated at the output node 53 of the TRX for supply to the AFE module 3. When the booster module 12 is present, the boosted power signal Vboost has its level controlled via the power levelling loop comprising the second detector 22, transmitting circuitry in the form of RF choke 54, receiving circuitry in the form of RF choke 56, integrator 34 and attenuation circuitry 30. The levelled, boosted power signal Vboost is then supplied at the output connector 62 of the booster to the AFE module 3.

The coaxial cable 14 is used for the transmission of the detected level of the boosted signal $V_{BDET}$ back to the amplification stages 4a,4b. The coaxial cable is also used to transmit the power amplified signal Vamp to the booster module 12. The signal Vamp is at RF frequencies of the order of 900 MHz for the GSM standard (other frequencies apply in other standards), and thus cannot pass through the RF chokes 54, 56. These thus prevent that RF signal Vamp from travelling down line 42 or from affecting the second detector 22. The capacitors 50, 63 will pass the RF signal because of its high frequency. Thus, the coaxial cable 14 provides a transmission path for both the amplified RF signal Vamp and the d.c. detected level $V_{BDET}$. Thus, the power levelling loop can be closed in a simple and effective manner. In particular, it does not require any modifications to the backplane of the rack 11 when the booster module 12 replaces the transceiver module TRX 1.

The system described above makes use of the existing cabling between the output of the transceiver and the input of the booster, therefore minimising the changes to other modules at the BTS. The possibility of noise pick-up is minimised, since the feedback path is maintained in a coaxial cable and does not pass near any high speed digital signal lines. The system described above has the booster module within the BTS. It would however be possible to move the booster module from the BTS, for example to the masthead, increasing the length of the coaxial cable. The effect of any propagation delays would have to be taken into account.

In the system described above, the detected voltage level of the boosted signal is fed back to the power levelling loop as an analogue voltage. Alternatively, it could be fed back in a digitised form which would increase the signal to noise ratio, but would require the use of an A to D converter.

Another way in which the voltage output of the detector in the booster may be fed back to the preamp is if at was modulated onto a carrier frequency. For instance, this could take the form of 100 MHz FM modulated carrier generated in the booster, transmitted onto the coaxial cable by means of a duplexer and extracted by another duplexer at the other end of the coaxial cable. This carrier could then be demodulated and the original detector signal restored. Depending on the difference between the main carrier frequency and the feedback carrier frequency, a duplex filter may be required to multiplex these signals in place of the choke system described above.

What is claimed is:

1. A power levelling loop for a base transceiver system comprising:

first amplification circuitry connected to receive an RF input signal and to supply a first amplified signal to an output node;

first detection circuitry for detecting said first amplified signal and connectable to modify the amplification factor of the first amplification circuitry in dependence on the detected level of the first amplified signal;

switch circuitry having a first input connected to the first detection circuitry and a second input connected to means for receiving a detected level of a second amplified signal, the switch being controllable to select the first or second input, wherein when the second input is selected the amplification factor of the first amplification circuitry is modified in accordance with the detected level of the second amplified signal.

2. A power levelling Loon as claimed in claim 1, wherein the output node is connected to a coaxial cable which transmits the first amplified signal from the first amplification circuitry and supplies the detected level of the second amplified signal to the output node.

3. A power levelling loop according to claim 1, which includes a booster module connected to the output node, the booster module including a booster amplifier for generating the second amplified signal.

4. A power levelling loop according to claim 3, in which the booster module includes a detection circuit for supplying the detected level of the second amplified signal.

5. A power levelling loop according to claim 1 wherein the means for receiving the detected level of the second amplified signal comprises a device for transmitting a low frequency signal while preventing passage of the high frequency first amplified signal.

6. A power levelling loop according to claim 3 wherein the booster module comprises means for transmitting the detected level of the second amplified signal to the output node, the transmitting means comprising a device for transmitting the low frequency detected level of the second amplified signal while preventing passage of the high frequency RF input.

7. A transceiver module for a base transmitter system in a mobile communication network comprising:

an input node connected to receive an RF input signal;

first amplification circuitry connected to the input node and to supply a first amplified signal to an output node;

first detection circuitry for detecting said first amplified signal and connectable to modify the amplification factor of the first amplification circuitry in dependence on the detected level of the first amplified signal;

switch circuitry having a first input connected to the first detection circuitry and a second input connected to means for receiving a detected level of a second amplified signal, the switch being controllable to select the first or second input, wherein when the second input is selected the amplification factor of the first amplification circuitry is modified in accordance with the detected level of the second amplified signal.

* * * * *